United States Patent
Matsuda et al.

(10) Patent No.: US 10,930,743 B2
(45) Date of Patent: Feb. 23, 2021

(54) LAYERED STRUCTURE, SEMICONDUCTOR DEVICE INCLUDING LAYERED STRUCTURE, AND SEMICONDUCTOR SYSTEM INCLUDING SEMICONDUCTOR DEVICE

(71) Applicant: FLOSFIA INC., Kyoto (JP)

(72) Inventors: Tokiyoshi Matsuda, Kyoto (JP); Takashi Shinohe, Kyoto (JP); Toshimi Hitora, Kyoto (JP)

(73) Assignee: FLOSFIA INC., Kyoto (JP)

( * ) Notice: Subject to any disclaimer, the term of this patent is extended or adjusted under 35 U.S.C. 154(b) by 10 days.

(21) Appl. No.: 16/020,240

(22) Filed: Jun. 27, 2018

(65) Prior Publication Data
US 2019/0006472 A1  Jan. 3, 2019

(30) Foreign Application Priority Data

Jun. 28, 2017 (JP) .............................. JP2017-126568
Sep. 29, 2017 (JP) .............................. JP2017-191609

(51) Int. Cl.
*H01L 29/24* (2006.01)
*H01L 29/04* (2006.01)
(Continued)

(52) U.S. Cl.
CPC .............. *H01L 29/24* (2013.01); *C23C 16/40* (2013.01); *C23C 16/4486* (2013.01);
(Continued)

(58) Field of Classification Search
CPC ..... C23C 16/44; C23C 16/40; C23C 16/4486; H01L 21/0242; H01L 21/02488; H01L 21/02494; H01L 21/02565; H01L 21/0259; H01L 21/0262; H01L 29/04; H01L 29/24; H01L 29/737; H01L 29/7787; H01L 21/02483; H01L 21/02576;
(Continued)

(56) References Cited

U.S. PATENT DOCUMENTS

| 2015/0179445 A1* | 6/2015 | Sasaki | .................. C30B 23/025 |
| | | | 257/43 |
| 2015/0194479 A1 | 7/2015 | Kaneko et al. | |
| 2017/0179249 A1 | 6/2017 | Oda et al. | |

FOREIGN PATENT DOCUMENTS

JP    2017-007871    1/2017

OTHER PUBLICATIONS

Tahara et al., "Heteroepitaxial growth of epsilon-(AlxG1-x)2O3 alloy films on c-plane AlNtemplates by mist chemical vapor deposition", Appl. Phys. Lett. 112 p. 152102-1-152102-5 (Year: 2018).*

(Continued)

*Primary Examiner* — Meiya Li
(74) *Attorney, Agent, or Firm* — Wenderoth, Lind & Ponack, L.L.P.

(57) ABSTRACT

In a first aspect of a present inventive subject matter, a layered structure includes a first semiconductor layer including an ε-phase crystalline oxide semiconductor with a first composition, and a second semiconductor layer including an ε-phase crystalline oxide semiconductor with a second composition that is different from the first composition of the first semiconductor layer, and the second semiconductor layer is layered on the first semiconductor layer.

19 Claims, 7 Drawing Sheets

(51) Int. Cl.
| | |
|---|---|
| *H01L 29/778* | (2006.01) |
| *H01L 29/737* | (2006.01) |
| *H01L 21/02* | (2006.01) |
| *H01L 29/08* | (2006.01) |
| *H01L 27/12* | (2006.01) |
| *C23C 16/40* | (2006.01) |
| *H01L 29/66* | (2006.01) |
| *C23C 16/448* | (2006.01) |
| *H01L 29/786* | (2006.01) |
| *C23C 16/44* | (2006.01) |

(52) U.S. Cl.
CPC ...... *H01L 21/0242* (2013.01); *H01L 21/0259* (2013.01); *H01L 21/0262* (2013.01); *H01L 21/02483* (2013.01); *H01L 21/02488* (2013.01); *H01L 21/02494* (2013.01); *H01L 21/02565* (2013.01); *H01L 21/02576* (2013.01); *H01L 21/02579* (2013.01); *H01L 21/02581* (2013.01); *H01L 21/02628* (2013.01); *H01L 27/1229* (2013.01); *H01L 29/04* (2013.01); *H01L 29/0891* (2013.01); *H01L 29/66969* (2013.01); *H01L 29/737* (2013.01); *H01L 29/7371* (2013.01); *H01L 29/7786* (2013.01); *H01L 29/7787* (2013.01); *H01L 29/786* (2013.01); *H01L 29/7869* (2013.01); *C23C 16/44* (2013.01)

(58) Field of Classification Search
CPC ......... H01L 21/02579; H01L 21/02581; H01L 21/02628; H01L 29/0891; H01L 29/66969; H01L 29/7371; H01L 29/7786; H01L 29/786
See application file for complete search history.

(56) References Cited

OTHER PUBLICATIONS

Sabino et al., "Role of atomic radius and d-state hybridization in the staility of the crystal structure of M2O3 (M=Al, Ga,In) oxides", Phys. Rev. B90, 155206 (2014). (Year: 2014).*

Rustum Roy, et al. "Polymorphism of $Ga_2O_3$ and the System $Ga_2O_3$—$H_2O$", vol. 74, pp. 719-722, Feb. 5, 1952.

Kentaro Kaneko, "Growth and Physical Properties of Corundum-Structured Gallium Oxide Alloy Thin Films", Dissertation, Kyoto Univ., Mar. 2013 with English Abstract.

Yuichi Oshima, et al., "Epitaxial Growth of Phase-Pure $\varepsilon$-$Ga_2O_3$ by Halide Vapor Phase Epitaxy", Journal of Applied Physics 118, 085301, pp. 085301-1-085301-5, 2015.

Hiroyuki Nishinaka, et al. "Heteroepitaxial Growth of $\varepsilon$-$Ga_2O_3$ Thin Films on Cubic (111) MgO and (111) Yttria-Stabilized Zirconia Substrates by Mist Chemical Vapor Deposition", Japanese Journal of Applied Physics 55, pp. 1202BC-1-1202BC-4, Nov. 11, 2016.

Masaya Oda, et al., "Schottky Barrier Diodes of Corundum-Structured Gallium Oxide Showing On-Resistance of 0.1 m$\Omega$-cm$^2$ Grown by MIST EPITAXY", Applied Physics Express 9, 021101, pp. 021101-1-021101-3, 2016.

Daisuke Shinohara and Shizuo Fujita, "Heteroepitaxy of Corundum-Structured $\alpha$-$Ga_2O_3$Thin Films on $\alpha$-$Al_2O_3$ Substrates by Ultrasonic Mist Chemical Vapor Deposition", Japanese Journal of Applied Physics, vol. 47, No. 9, pp. 7311-7313, 2008.

* cited by examiner

LAYERED STRUCTURE, SEMICONDUCTOR DEVICE INCLUDING LAYERED STRUCTURE, AND SEMICONDUCTOR SYSTEM INCLUDING SEMICONDUCTOR DEVICE

CROSS-REFERENCE TO RELATED APPLICATION

This application is a new U.S. patent application that claims priority benefit of Japanese patent applications No. 2017-126568 filed on Jun. 28, 2017, and No. 2017-191609 filed on Sep. 29, 2017, the disclosures of which are incorporated herein by reference in its entirety.

BACKGROUND OF THE INVENTION

Field of the Invention

The present disclosure relates to a layered structure. Also, the present disclosure relates to a semiconductor device including a layered structure. Furthermore, the present disclosure relates to a semiconductor system including a semiconductor device.

Description of the Related Art

As a background, gallium oxide ($Ga_2O_3$) has been reported to possess five different polymorphs including α-, β-, γ-, δ-, and ε-phases. Among these five polymorphs, β-$Ga_2O_3$ is believed to be thermodynamically the most stable, and α-$Ga_2O_3$ and ε-$Ga_2O_3$ are believed to be metastable. Gallium oxide ($Ga_2O_3$) exhibits a wide band gap and attracts more attention as a potential semiconductor material for semiconductor devices (see NPL 6: Daisuke SHINOHARA and Shizuo FUJITA, "Heteroepitaxy of Corundum-structured α-Ga2O3 thin films on α-Al2O3 Substrates by ultrasonic mist chemical vapor deposition", Japanese Journal of Applied Physics, Vol. 47, No. 9, 2008, pp. 7311-7313).

According to NPL 2, it is suggested that a band gap of gallium oxide ($Ga_2O_3$) is able to be controlled by forming mixed crystal with indium and/or aluminum, individually, or in combination of them. Among them, InAlGaO based semiconductors represented by $In_{X'}$—$Al_{Y'}$—$Ga_{Z'}O_3$ ($0 \leq X' \leq 2$, $0 \leq Y' \leq 2$, $0 \leq Z' \leq 2$, $X'+Y'+Z'=1.5$ to 2.5) are extremely attractive materials. (For reference, see NPL 2: Kentaro KANEKO, "Fabrication and physical properties of corundum-structured alloys based on gallium oxide", Dissertation, Kyoto Univ., March 2013).

Furthermore, the five different polymorphs of gallium oxide ($Ga_2O_3$) have respective attractive characteristics. For example, β-$Ga_2O_3$ that is believed to be thermodynamically the most stable under atmospheric pressure can be used to develop larger wafers, however, α-$Ga_2O_3$ that is possible to be heteroepitaxially grown on sapphire substrates is expected to be commercially available with cost less than β-$Ga_2O_3$ (see NPL4: Hiroyuki NISHINAKA, et al. "Heteroepitaxial growth of ε-$Ga_2O_3$ thin films on cubic (111) MgO and (111) yttria-stabilized zirconia substrates by mist chemical vapor deposition", November, 2016). Also, ε-$Ga_2O_3$ is suggested to have a thermal stability up to 870'C that is higher than the thermal stability of α-$Ga_2O_3$ (see NPL1: Rustum ROY, et al. "Polymorphism of $Ga_2O_3$ and the System $Ga_2O_3$—$H_2O$", February, 1952), and ε-$Ga_2O_3$ as well as α-$Ga_2O_3$ and β-$Ga_2O_3$ is known to have a large band gap about 5 eV and has great potential for use in various heterojunction electronic devices. Compared with the number of researches of β-$Ga_2O_3$, the number of the researches of ε-$Ga_2O_3$ is still small, but it is suggested that a single crystal of ε-$Ga_2O_3$ is formed by HVPE (Halide Vapor Phase Epitaxy) method (For reference, see JP2017-7871, and NPL3: Yuichi OSHIMA, et al., "Epitaxial growth of phase-pure ε-$Ga_2O_3$ by halide vapor phase epitaxy", Journal of applied physics 118, 085301, 2015). Also, it is suggested that ε-$Ga_2O_3$ thin films are formed by mist Chemical Vapor Deposition (CVD) (see NPL4: Hiroyuki NISHINAKA, et al. "Heteroepitaxial growth of ε-$Ga_2O_3$ thin films on cubic (111) MgO and (111) yttria-stabilized zirconia substrates by mist chemical vapor deposition", published online Nov. 11, 2016).

SUMMARY OF THE INVENTION

In a first aspect of a present inventive subject matter, a layered structure includes a first semiconductor layer containing an ε-phase crystalline oxide semiconductor with a first composition, and a second semiconductor layer containing an ε-phase crystalline oxide semiconductor with a second composition that is different from the first composition of the first semiconductor layer. The second semiconductor layer is layered on the first semiconductor layer.

It is suggested that the first semiconductor layer includes as a major metal component at least one selected from among gallium, indium and aluminum.

Also, it is suggested that the first semiconductor layer includes a mixed crystal. The mixed crystal comprising as a major metal component at least two metals selected from among gallium, indium and aluminum as a major metal component.

According to an embodiment of a present inventive subject matter, the first semiconductor layer contains gallium as a major metal component.

Also, according to an embodiment of a present inventive subject matter, the first semiconductor layer includes a mixed crystal of two or more metals.

It is suggested that the second semiconductor layer includes gallium as a major metal component.

Furthermore, it is suggested that the second semiconductor layer contains ε-$Ga_2O_3$.

According to an embodiment of a present inventive subject matter, the second semiconductor layer contains a mixed crystal.

Also, it is suggested that the semiconductor layer contains aluminum.

According to an embodiment of a present inventive subject matter, the second semiconductor layer contains $(GaInAl)_2O_3$.

Also, it is suggested that a layered structure may include three or more semiconductor layers including the first semiconductor layer and the second semiconductor layer.

Furthermore, it is suggested that a layered structure includes a heterojunction between the first semiconductor layer and the second semiconductor layer.

Also, it is suggested that a layered structure includes a heterojunction between two semiconductor layers selected from among three or more semiconductor layers of the layered structure.

According to an embodiment of a present inventive subject matter, it is suggested that the layered structure includes an electrically insulating layer.

In a second aspect of a present inventive subject matter, a semiconductor device includes a layered structure including a first semiconductor layer containing an ε-phase crystalline oxide semiconductor with a first composition, and a second semiconductor layer containing an ε-phase crystalline oxide semiconductor with a second composition that is different from the first composition of the first semiconductor layer. The semiconductor device further includes a first electrode electrically connected to the layered structure, and a second electrode electrically connected to the layered structure.

Also, it is suggested that the semiconductor device may be a power device.

According to an embodiment of a present inventive subject matter, the semiconductor device is a semiconductor device with a high frequency characteristic.

Also, according to an embodiment of a present inventive subject matter, the semiconductor device is a high-electron-mobility transistor. Furthermore, as an embodiment, the semiconductor device may be a heterojunction bipolar transistor.

In a third aspect of a present inventive subject matter, a system includes a circuit board and a semiconductor device that is electrically connected to the circuit board.

DETAILED DESCRIPTION OF EMBODIMENTS

Figure 1:
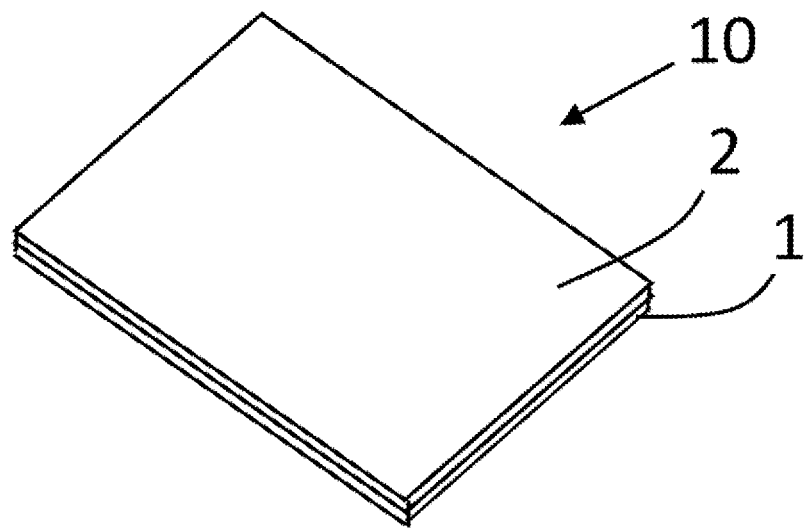
FIG. 1 shows a schematic perspective view of a layered structure of a first embodiment according to a present inventive subject matter.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a layer, a device, and/or a system in addition to the orientation depicted in the figures.

According to a first aspect of a present inventive subject matter, a layered structure includes a first semiconductor layer containing an ε-phase crystalline oxide semiconductor with a first composition, and a second semiconductor layer containing an ε-phase crystalline oxide semiconductor with a second composition that is different from the first composition of the first semiconductor layer. The second semiconductor layer layered on the first semiconductor layer. Inventors of the subject patent application found out that the layered structure of the first semiconductor layer containing the ε-phase crystalline oxide semiconductor with a first composition and the second semiconductor layer containing the ε-phase crystalline oxide semiconductor with a second composition that is different from the first composition of the first semiconductor layer is useful for a semiconductor device and/or a semiconductor system required to obtain high frequency characteristics.

According to an embodiment of a present inventive subject matter, if a first semiconductor layer contains an ε-phase crystalline oxide semiconductor and the first semiconductor layer contains gallium as a major metal component, the first semiconductor layer is not further limited to. The first semiconductor layer may contain a dopant. Also, the first semiconductor layer may include an off-angle.

According to an embodiment of a present inventive subject matter, the first semiconductor layer may contain a dopant, which may be a known one. Examples of dopant include an n type dopant and p type dopant. Examples of the n type dopant include tin (Sn), germanium (Ge), silicon (Si), titanium (Ti), zirconium (Zr), vanadium (V), niobium (Nb), and lead (Pb).

According to embodiments of a present inventive subject matter, the n type dopant contained in the first semiconductor layer is preferably Sn, Ge, or Si. Also, the first semiconductor layer may unintentionally contain Si, and there is a possibility that Sn, Ge, and/or Si contained in the first semiconductor layer may function as n type dopant.

Also, examples of the p type dopant include magnesium (Mg), hydrogen (H), lithium (Li), natrium (Na), kalium (K), rubidium (Rb), cesium (Cs), fransium (Fr), beryllium (Be), calcium (Ca), strontium (Sr), barium (Ba), radium (Ra), manganese (Mn), iron (Fe), cobalt (Co), nickel (Ni), palladium (Pd), copper (Cu), silver (Ag), gold (Au), zinc (Zn), cadmium (Cd), mercury (Hg), titanium (Ti), rudibium (Rb), nitrogen (N), and phosphorus (P). According to an embodiment of a present inventive subject matter, the first semiconductor layer or the second semiconductor layer of the layered structure may be a p type semiconductor layer.

The contained amount of dopant in a semiconductor layer is preferably 0.00001 atomic percent (at. %) or more in a composition of the semiconductor layer. The semiconductor layer may be the first semiconductor layer. Also, the semiconductor layer may be the second semiconductor layer. A range of the amount of dopant contained in the semiconductor layer is preferably in 0.00001 at. % to 20 at. %. The range of the amount of dopant contained in the semiconductor layer is most preferably in 0.00001 at. % to 10 at. % to enhance electrical properties of the semiconductor layer and/or a layered structure including the semiconductor layer.

According to an embodiment of a present inventive subject matter, the first semiconductor layer may include an off-angle. The term "off-angle" herein is an angle of inclination to a principal crystalline plane as a reference plane of a semiconductor layer, that may be the first semiconductor layer and/or the second semiconductor layer. Usually the term "off-angle" is used as an inclination angle by the principal crystalline plane and a crystalline growth surface. The direction of inclination of "off-angle" is not particularly limited, however, the "off-angle" is preferably in a range of 0.2° to 8.0°. If the first semiconductor layer includes an off-angle in a preferable range, mobility that is a semiconductor property of the first semiconductor layer is further enhanced. The second semiconductor layer also may include an off-angle.

The first semiconductor layer may contain indium, gallium, or aluminum as a major metal component. According to an embodiment of a present inventive subject matter, the first semiconductor layer may contain a mixed crystal of ε-phase crystalline oxide, and the mixed crystal of ε-phase crystalline oxide may contain gallium as a major metal component and further may contain at least one selected from indium and aluminum. Also, according to an embodiment of a present inventive subject matter, the first semiconductor layer contains ε-phase InAlGaO-based semiconductor.

According to an embodiment of a present inventive subject matter, the first semiconductor layer most preferably contains gallium as a major metal component.

The term "major metal component" of a semiconductor layer herein means that the atomic ratio of a major metal component to entire metal components of the semiconductor layer is 0.5 or more. The atomic ratio of the major metal component to entire metal components of the semiconductor layer is preferably 0.7 or more and further preferably 0.8 or more. The semiconductor layer may be the first semiconductor layer, the second semiconductor layer, and/or a third semiconductor layer included in a layered structure.

For example, if the first semiconductor layer contains ε-phase gallium oxide (ε-$Ga_2O_3$), the atomic ratio of gallium to entire metal components of the first semiconductor layer is 0.5 or more. Further preferably the atomic ratio of gallium to entire metal components of the first semiconductor layer is preferably 0.7 or more. Further preferably the atomic ratio of gallium of the first semiconductor layer to entire metal components contained in the first semiconductor layer is 0.8 or more.

For example, if the second semiconductor layer contains ε-phase aluminum gallium oxide, the atomic ratio of aluminum and gallium to entire metal components of the second semiconductor layer is 0.5 or more. The atomic ratio of aluminum gallium to entire metal components of the second semiconductor layer is preferably 0.7 or more, and further preferably 0.8 or more.

Also, if the first semiconductor layer contains ε-phase indium aluminum gallium oxide, the atomic ratio of indium, aluminum and gallium to entire metal components of the first semiconductor layer is 0.5 or more. The atomic ratio of indium, aluminum and gallium to entire metal components of the first semiconductor layer is preferably 0.7 or more, and further preferably 0.8 or more.

A layered structure of a first semiconductor layer including an ε-phase crystalline oxide semiconductor with a first composition and a second semiconductor layer including an ε-phase crystalline oxide semiconductor with a second composition that is different from the first composition of the first semiconductor layer is able to be used for a semiconductor device requiring a high-frequency characteristic and/or a higher thermal stability than an α-phase crystalline oxide semiconductor.

The first semiconductor layer may be 1 μm or less in thickness. Also, the first semiconductor layer may be 1 μm or more in thickness. The shape of the first semiconductor layer is not particularly limited, and the first semiconductor layer may be a quadrangle including a rectangular shape and a square shape. Also, the shape of the first semiconductor layer may be a circular shape including an ellipse and a semicircle, for example. Furthermore, the shape of the first semiconductor layer may be a polygonal shape. The surface area of the first semiconductor layer according to an embodiment of a present inventive subject matter may not be particularly limited, however, the surface area of the first semiconductor layer may be 3 mm square or more. According to an embodiment of a present inventive subject matter, the first semiconductor layer is preferably free from a crack in a center area that is 3 mm square by an optical-microscopic surface observation. Also, the first semiconductor layer is further preferably free from a crack in a center area that is 5 mm square by an optical-microscopic surface observation. Furthermore, the crystalline oxide semiconductor film is most preferably free from a crack in a center area that is 9.5 mm square or more by an optical-microscopic surface observation. The first semiconductor layer may be a single crystal layer or a polycrystalline layer, and the first semiconductor layer is preferably a single crystal layer.

The second semiconductor layer is not particularly limited as long as the second semiconductor layer contains the second composition that is different from the first composition contained in the first semiconductor layer, however, according to embodiments of a present inventive subject matter, the second semiconductor layer contains an ε-phase crystalline oxide semiconductor and/or α-phase crystalline oxide semiconductor. Regarding the ε-phase crystalline oxide semiconductor, the second semiconductor layer may contain an ε-phase crystalline oxide semiconductor similarly to the ε-phase crystalline oxide semiconductor contained in the first semiconductor layer. According to embodiments of a present inventive subject matter, the second semiconductor layer contains a major metal component that preferably contains gallium. The second semiconductor layer may contain ε-$Ga_2O_3$. Also, the second semiconductor layer may contain a mixed crystal of ε-$Ga_2O_3$. The second semiconductor layer may further preferably contain aluminum because semiconductor properties at an interface of the first semiconductor layer and the second semiconductor layer becomes enhanced.

As an embodiment, a method of forming a semiconductor layer is explained as follows, however, a first semiconductor layer, a second semiconductor layer and/or a layered structure is not particularly limited to the method.

Figure 9:
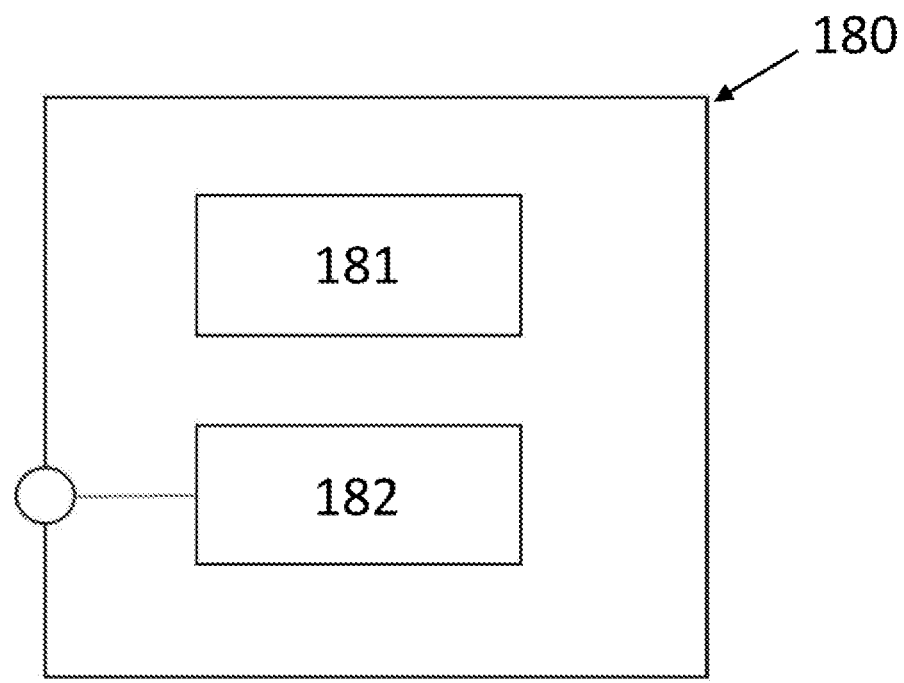
FIG. 9 shows a schematic view of a semiconductor system according to a tenth embodiment of a present inventive subject matter.

As one of a suitable method, for example, using a mist CVD method shown in FIG. 9, the method includes turning a raw material solution into atomized droplets (atomization of raw material solution), carrying the atomized droplets into a film-formation chamber (carrying atomized droplets), forming a film by causing a thermal reaction of the atomized droplets to form a semiconductor layer on a base (forming a film). According to an embodiment of a present inventive subject matter, the base may be a crystalline substrate. The substrate may further include a buffer layer formed on the substrate, according to an embodiment of a present inventive subject matter.

<Crystalline Substrate>

As a crystalline substrate, the crystalline substrate is not particularly limited, however, preferable examples of the crystalline substrate include a crystalline substrate with a corundum structure formed on at least a part of a principal plane of the crystalline substrate, a crystalline substrate on an entire of the principal plane of the crystalline substrate, a crystalline substrate including an ε-phase crystalline structure, a crystalline substrate including a hexagonal crystal structure, and a crystalline substrate including a β-phase crystalline structure. Also, the crystalline substrate preferably has a crystalline structure on at least a part of the principal plane that is positioned on a side of a crystalline growth surface. The crystalline substrate further preferably has a crystalline structure entirely on the principal plane. Furthermore, the crystalline substrate may include an off-angle. The shape of the crystalline substrate is not particularly limited as long as the crystalline substrate has a plate shape and is able to support a layer (film) to be formed on. The crystalline substrate may be an electrically-insulating substrate. Also, the crystalline substrate may be a semiconductor substrate. Furthermore, the crystalline substrate may be an electrically-conductive substrate. The shape of the crystalline substrate may be, for example, a circular shape. The circular shape may include shapes of a circle, a semicircle and/or an ellipse. The shape of the crystalline substrate may be, for example, a polygonal shape. The polygonal shape may include a triangle, a square, a rectangle, a pentagon, a hexagon, a heptagon, an octagon and a nonagon. Accordingly, a crystalline substrate according to an embodiment of a present inventive subject matter, the shape of the crystalline substrate would be selectable to form a semiconductor layer (film) in a desired shape on the crystalline substrate. Furthermore, according to an embodiment of a present inventive subject matter, the crystalline substrate may have a larger area to form a crystalline oxide film that has a larger area on the crystalline substrate. Furthermore, a material for the substrate is not particularly limited as long as an object of the present inventive subject matter is not interfered with, and also, the material may be a known one. Examples of a substrate material include $\alpha$-$Al_2O_3$, GaN, SiC, and $\beta$-$Ga_2O_3$. A substrate with a corundum structure would be a preferable substrate for an embodiment of a present inventive subject matter to form a first semiconductor layer and a second semiconductor layer on the first semiconductor layer suitably.

Examples of the buffer layer include a buffer layer of iron oxide, a buffer layer of gallium oxide, a buffer layer of aluminum oxide, and a buffer layer of a mixed crystal oxide of at least two selected from among iron, gallium, and aluminum. According to embodiments of a present inventive subject matter, the buffer layer may have an ε-phase crystal structure, a hexagonal crystal structure, a β-phase crystalline structure, a corundum structure and/or an amorphous structure. The buffer layer may be a semiconductor layer or may be an electrically-insulating layer. In a case that a buffer layer has a corundum structure, the buffer layer preferably contains an n-type dopant. The buffer layer further preferably contains tin as a dopant. Using a dopant as mentioned above, for example, an ε-phase semiconductor layer that is a crystalline semiconductor layer is able to be formed on the buffer layer of the substrate in a better quality. The buffer layer may be formed on a crystalline substrate by a known method. Also, the buffer layer may be formed by a method similarly to a method to form a semiconductor layer.

<Forming Atomized Droplets from a Raw Material Solution>

A raw material solution is turned into atomized droplets floating in a space of a container of a mist generator. The raw material solution may be turned into atomized droplets by a known method, however, according to an embodiment of a present inventive subject matter, the raw material solution is preferably turned into atomized droplets by ultrasonic vibration. Atomized droplets including mist particles and obtained by using ultrasonic vibration and floating in the space have the initial velocity that is zero. Since atomized droplets floating in the space is carriable as a gas, the atomized droplets floating in the space are preferable to avoid damage caused by the collision energy without being blown like a spray. The size of droplets is not limited to a particular size, and may be a few mm, however, the size of atomized droplets is preferably 50 μm or less. The size of droplets is further preferably in a range of 100 nm to 10 μm.

(Raw-Material Solution)

The raw-material solution is not particularly limited as long as a semiconductor film is formed from the raw-material solution by a mist CVD method. Examples of the raw-material solution include a solution of organometallic complex of a metal, and a solution of halide. The solution of organometallic complex includes a solution of acetylacetonate complex, for example. The solution of halide includes a solution of fluoride, a solution of chloride, a solution of bromide and a solution of iodide. Examples of the metal of organometallic complex include gallium, indium, and/or aluminum. According to an embodiment of a present inventive subject matter, the metal of organometallic complex preferably contains at least gallium. The amount of metal contained in the raw material solution is not particularly limited as long as an object of the present inventive subject matter is not interfered with, however, the amount of metal contained in the raw material solution is preferably 0.001 mol % to 50 mol %. The amount of metal contained in the raw material solution is further preferably 0.01 mol % to 50 mol %.

Also, according to an embodiment of a present inventive subject matter, a raw material solution may contain a dopant. By introducing a dopant into a raw material solution, it is possible to control electrical conductivity of a semiconductor layer, without ion implantation, for example, and thus, it is possible to form the semiconductor layer without breaking the crystalline structure of the semiconductor layer. Examples of n-type dopant include tin, germanium, silicon and lead.

The n-type dopant is preferably tin or germanium, and most preferably tin. Examples of p-type dopant include magnesium, calcium, and zinc. The dopant concentration in general may be in a range of $1\times10^{16}/cm^3$ to $1\times10^{22}/cm^3$. The dopant concentration may be at a lower concentration of, for example, approximately $1\times10^{17}/cm^3$ or less, also the dopant concentration may be at a high concentration of, for example, $1\times10^{2}/cm^3$ or more. According to embodiments of a present inventive subject matter, the dopant concentration is preferably $1\times10^{20}/cm^3$ or less, and further preferably $5\times10^{19}/cm^3$ or less.

According to an embodiment of a present inventive subject matter, a solvent of the raw material solution is not particularly limited and may be an inorganic solvent including water. Also, according to an embodiment, a solvent of the raw material solution may be an organic solvent including alcohol. Furthermore, according to an embodiment of a present inventive subject matter, a mixed solvent of water and alcohol may be used. According to embodiments of a present inventive subject matter, a solvent of the raw material solution preferably contains water, and a mixed solvent of water and alcohol is further preferably used, and most preferably, a solvent of the raw material solution is water, which may include, for example, pure water, ultrapure water, tap water, well water, mineral water, hot spring water, spring water, fresh water and ocean water. According to embodiments of a present inventive subject matter, ultrapure water is preferable as a solvent of a raw material solution.

(Carrying Atomized Droplets into a Supply Pipe that Functions as a Film-Formation Chamber)

Atomized droplets floating in the space of a container for forming atomized droplets are carried into a film-formation chamber by carrier gas. The carrier gas is not limited as long as an object of the present inventive subject matter is not interfered with, and thus, examples of the carrier gas may be an inert gas such as nitrogen and argon, may be an oxidizing gas such as oxygen and ozone, and may be a reducing gas such as a hydrogen gas and a forming gas. The type of carrier gas may be one or more, and a dilution gas at a reduced flow rate (e.g., 10-fold dilution gas) and the like may be used further as a second carrier gas. The carrier gas may be supplied from one or more locations. While the flow rate of the carrier gas is not particularly limited, the flow rate of the carrier gas may be in a range of 0.01 to 20 L/min. According to an embodiment of a present inventive subject matter, the flow rate of the carrier gas may be preferably in a range of 1 to 10 L/min. When a dilution gas is used, the flow rate of the dilution gas is preferably in a range of 0.001 to 5 L/min.

(Forming a Layer)

For forming a semiconductor layer, the atomized droplets carried into the film-formation chamber by carrier gas are thermally reacted (through "thermal reaction") to form a semiconductor layer on a base that is arranged in the film-formation chamber. The first semiconductor layer and the second semiconductor layer may be formed similarly as a semiconductor layer. Herein, "thermal reaction" works as long as the atomized droplets react by heat, and thus, the term "thermal reaction" herein may include a chemical reaction, and/or a physical reaction. The "thermal reaction" herein may include another reaction, and conditions of reaction are not particularly limited as long as an object of a present inventive subject matter is not interfered with. According to embodiments of a present inventive subject matter, the thermal reaction is conducted at an evaporation temperature or higher temperatures of the evaporation temperature of the solvent of the raw material solution, however, a range of temperature for the "thermal reaction" are not too high and may be below 1000° C., for example. The thermal reaction is preferably conducted at a temperature in a range of 200° C. to 500° C. and further preferably conducted at a temperature in a range of 250° C. to 450° C. According to embodiments of a present inventive subject matter, the thermal reaction is most preferably conducted at a temperature in a range of 250° C. to 400° C. Also, the thermal reaction may be conducted in any atmosphere of a vacuum, a non-oxygen atmosphere, a reducing-gas atmosphere, and an oxidizing-gas atmosphere. Also, the thermal reaction may be conducted in any condition of under an atmospheric pressure, under an increased pressure, and under a reduced pressure. According to embodiments of a present inventive subject matter, the thermal reaction is preferably conducted under an atmospheric pressure. Also, a film thickness of crystalline oxide semiconductor film is able to be set by adjusting a film-formation time.

A semiconductor layer obtained through the above-mentioned method having sufficient semiconductor properties and decreased number of cracks is industrially useful. A layered structure is obtainable by forming a first semiconductor layer and forming a second semiconductor layer on the first semiconductor layer to have a heterojunction. According to an embodiment of a present inventive subject matter, the layered structure including two semiconductor layers each with ε-phase semiconductor of different compositions from each other is able to be used for semiconductor devices requiring a high-frequency characteristic. Also, it is possible to separate one or more semiconductor layers as a semiconductor film or a layered structure from a substrate by a known method. Furthermore, the semiconductor film and/or the layered structure is possible to be washed, polished, and/or etched by a known method and used for a semiconductor device.

Semiconductor devices may be categorized as planar semiconductor devices and also as vertical semiconductor devices. Also, layered structures according to embodiments of a present inventive subject matter are suitably used for both planar semiconductor devices and vertical semiconductor devices. For example, according to an embodiment of a present inventive subject matter, a semiconductor device includes a layered structure, a first electrode, and a second electrode, the first electrode and the second electrode are in a planar arrangement at one side of the layered structure as a planar semiconductor device. Furthermore, according to an embodiment of a present inventive subject matter, a semiconductor device includes a layered structure, a first electrode arranged at a first side of the layered structure and a second electrode arranged at a second side opposite to the first side of the layered structure as a vertical semiconductor device. The semiconductor devices according to embodiments of a present inventive subject matter preferably utilize a high-frequency characteristic. The semiconductor devices according to embodiments of a present inventive subject matter are expected to be next generation switching devices to achieve high voltage, low loss, and high heat resistance, and are expected to be applied to power semiconductor devices (power devices) including a Schottky barrier diode (SBD), a metal-oxide-semiconductor field-effect transistor (MOSFET), JFET, a high-electron-mobility transistors (HEMT) or a heterojunction bipolar transistor (HBT). Examples of semiconductor devices utilizing high-frequency properties include a high-electron-mobility transistor (HEMT) and a heterojunction bipolar transistor (HBT). For example, HEMTs are able to be used in various systems including a parabolic antenna, a radar system, a car navigation system, and a base station for mobile devices such as mobile phones, smartphones, and wearable devices, for example.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a layer, a layered structure, a device, and/or a system in addition to the orientation depicted in the figures.

FIG. 1 shows a schematic perspective view of a layered structure of a first embodiment according to a present inventive subject matter. The layered structure 10 includes a first semiconductor layer 1 and a second semiconductor layer 2 that is layered on the first semiconductor layer 1. In this embodiment, the first semiconductor layer 1 contains an ε-phase crystalline oxide semiconductor with a first composition, and the second semiconductor layer 2 contains an ε-phase crystalline oxide semiconductor with a second composition that is different from the first composition of the first semiconductor layer 1.

According to an embodiment of a present inventive subject matter, the first semiconductor layer 1 may contain at least one selected from among gallium, indium and aluminum, and the first semiconductor layer 1 preferably contains at least gallium as a major metal component.

According to an embodiment of a present inventive subject matter, the first semiconductor layer 1 of a layered structure contains ε-$Ga_2O_3$.

Also, according to an embodiment of a present inventive subject matter, the first semiconductor layer 1 may contain a mixed crystal as the ε-phase crystalline oxide semiconductor. The mixed crystal containing at least two metals may be selected from among gallium, indium and aluminum as a major metal component.

According to an embodiment of a present inventive subject matter, a layered structure including a first semiconductor layer that contains ε-phase crystalline oxide semiconductor with a first composition and a second semiconductor layer that contains ε-phase crystalline oxide semiconductor with a second composition that is different from the first composition is useful for a semiconductor device requiring a high-frequency characteristic. According to an embodiment of a present inventive subject matter, the first semiconductor layer may contain ε-$Ga_2O_3$. Also, according to an embodiment of a present inventive subject matter, the first semiconductor layer may contain a mixed crystal as the ε-phase crystalline oxide semiconductor.

According to an embodiment of a present inventive subject matter, the layered structure may include three or more layers including the first semiconductor layer 1 and the second semiconductor layer 2. The layered structure may include a heterojunction between the first semiconductor layer and the second semiconductor layer. According to an embodiment of a present inventive subject matter, the layered structure may include a heterojunction between two semiconductor layers selected from among the three or more semiconductor layers. Also, according to an embodiment of a present inventive subject matter, the layered structure may include an electrically insulating layer.

Figure 2:
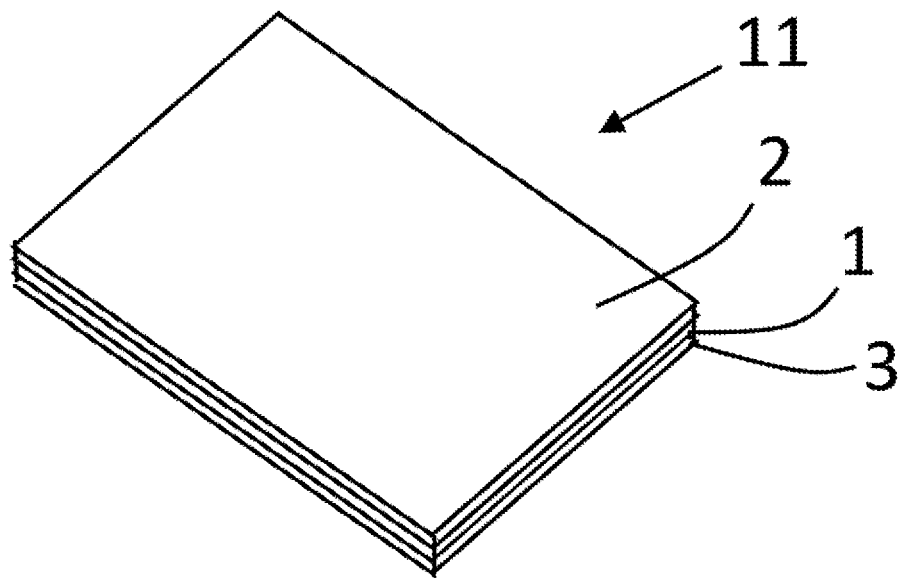
FIG. 2 shows a schematic perspective view of a layered structure of a second embodiment according to a present inventive subject matter.

FIG. 2 shows a schematic perspective view of a layered structure 11 of a second embodiment according to a present inventive subject matter. The layered structure 11 includes a first semiconductor layer 1 that contains an ε-phase crystalline oxide semiconductor with a first composition, a second semiconductor layer 2 that contains an ε-phase crystalline oxide semiconductor with a second composition that is different from the first composition of the first semiconductor layer 1. The layered structure 11 includes a third layer 3. The third layer 3 may be a semiconductor layer, and the third semiconductor layer 3 may contain an ε-phase crystalline oxide semiconductor.

The third semiconductor layer 3 may contain ε-$Ga_2O_3$. Furthermore, according to an embodiment of a present inventive subject matter, the third semiconductor layer 3 may contain a mixed crystal as the ε-phase crystalline oxide semiconductor. The mixed crystal may contain ε-$Ga_2O_3$. Also, the mixed crystal of the second semiconductor layer may further contain aluminum. According to an embodiment of a present inventive subject matter, the second semiconductor layer may contain $(GaInAl)_2O_3$.

Also, according to an embodiment, the third layer 3 may be a layer closer to an electrically-insulating layer than to a semiconductor layer. The third layer 3 may contain gallium as a major metal component.

Embodiments of a semiconductor device according to a present inventive subject matter are explained as follows with reference to figures, however, the present inventive subject matter is not limited to these embodiments. A semiconductor device according to an embodiment of a present inventive subject matter, the layered structure and/or the semiconductor device may include another layer such as an electrically-insulating layer, a semi-insulating layer, a conductor layer, a semiconductor layer, a buffer layer, and/or an intermediate layer.

(HEMT)

Figure 3A:
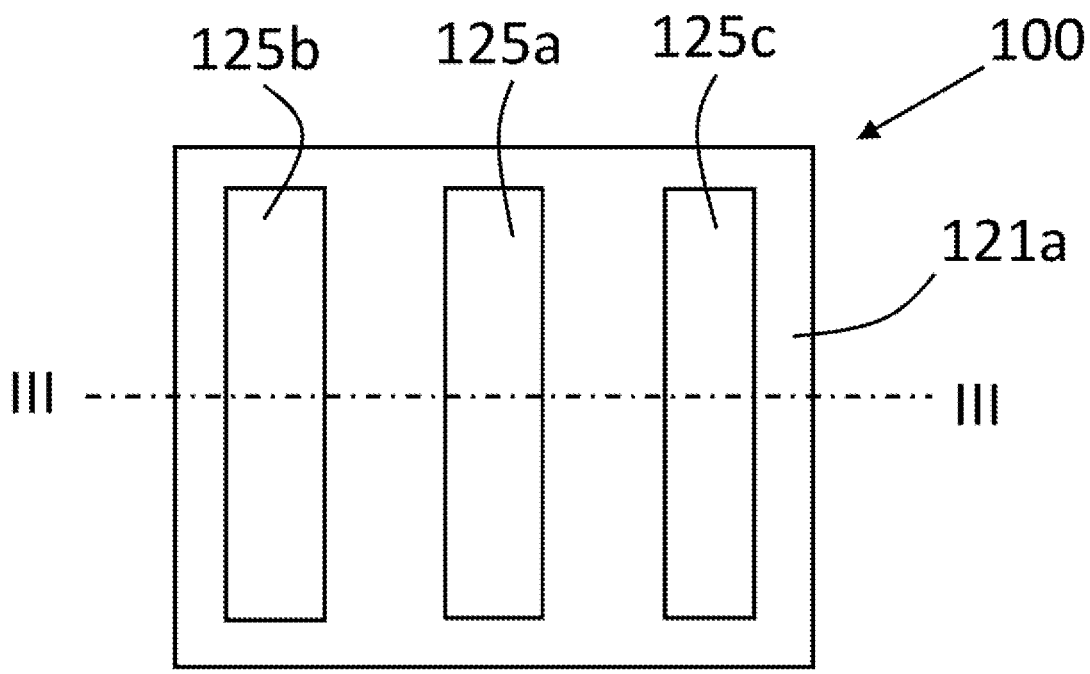
FIG. 3A shows a schematic top plan view of a semiconductor device of a third embodiment according to a present inventive subject matter.

FIG. 3A shows a schematic top plan view of a semiconductor device of a third embodiment according to a present inventive subject matter.

Figure 3B:
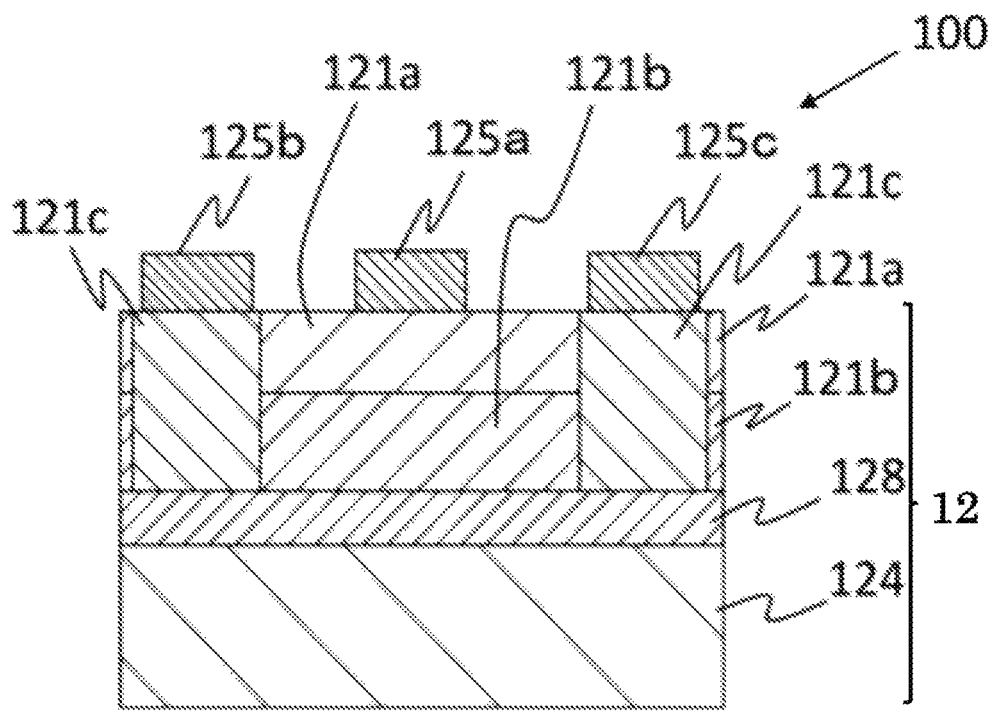
FIG. 3B shows a schematic cross-sectional view of the semiconductor device shown in FIG. 3A.

FIG. 3B shows a schematic cross-sectional view of the semiconductor device shown in FIG. 3A. A semiconductor device 100 includes a layered structure 12 including a first semiconductor layer 121b and a second semiconductor layer 121a layered on the first semiconductor layer 121b. The first semiconductor layer 121b contains an ε-phase crystalline oxide semiconductor with a first composition. The second semiconductor layer 121a contains an ε-phase crystalline oxide semiconductor with a second composition that is different from the first composition of the first semiconductor layer 121b. The semiconductor device 100 of this embodiment is a high-electron-mobility transistor (HEMT). The first semiconductor layer 121b is an n-type semiconductor layer with a first bandgap. The second semiconductor layer 121a is an n-type semiconductor layer with a second bandgap wider than the first bandgap of the first semiconductor layer 121b. The semiconductor device 100 may include three or more layers including the first semiconductor layer 121b and the second semiconductor layer 121a arranged at a first side of the first semiconductor layer 121b. The three or more layers of the semiconductor device 100 may further include a third layer 128 arranged on the first semiconductor layer 121b. The third layer 128 is arranged at a second side of the first semiconductor layer 121b opposite to the first side of the first semiconductor layer 121b. The third layer 128 of the layered structure 12 in this embodiment may be a buffer layer. The three or more layers of the layered structure 12 of the semiconductor device 100 may further include a semi-insulating layer 124 positioned under the buffer layer 128, as shown in FIG. 3B. The semiconductor device 100 further includes a gate electrode 125a, a source electrode 125b, and a drain electrode 125c arranged at one side of the semiconductor device 100. The layered structure 12 may further include an n+ type semiconductor layer 121c positioned in the first semiconductor layer 121b and the second semiconductor layer 121a.

Materials for each electrode may be known electrode materials. Examples of such an electrode material include metal, such as aluminum (Al), molybdenum (Mo), cobalt (Co), zirconium (Zr), tin (Sn), niobium (Nb), iron (Fe), Cr (chromium), Ta (tantalum), Ti (titanium), Au (gold), Pt (platinum), V (vanadium), Mn (manganese), Ni (nickel), Cu (copper), Hf (hafnium), W (tungsten), Ir (Iridium), Zn (zinc), In (indium), Pd (palladium), Nd (neodymium), and/or Ag (silver), and an alloy containing at least two metals selected from among Al, Mo, Co, Zr, Sn, Nb, Fe, Cr, Ta, Ti, Au, Pt, V, Mn, Ni, Cu, Hf, W, Ir, Zn, In, Pd, Nd, and Ag. Also, examples the electrode material further include metal oxide conductive films, such as a tin oxide film, a zinc oxide film, an indium oxide film, an indium tin oxide (ITO), and an indium zinc oxide (IZO), organic conductive compounds, such as polyaniline, polythiophene, and polypyrrole, and mixtures of at least two selected from among the examples.

The electrodes may be formed by a known method, such as vacuum deposition, sputtering, and printing for example.

The n+ type semiconductor layer may preferably contain the same major metal component as the major metal component contained in the first semiconductor layer 121b and/or the second semiconductor layer 121a.

According to another embodiment of a present inventive subject matter, a semiconductor device may include a first layered structure including two or more layers including a first semiconductor layer may be used as an n type semiconductor layer with the first, bandgap, and may further include a second layered structure including two or more layers including a second semiconductor layer may be used for an n type semiconductor layer with the second bandgap wider than the first bandgap of the first layered structure.

Figure 4:
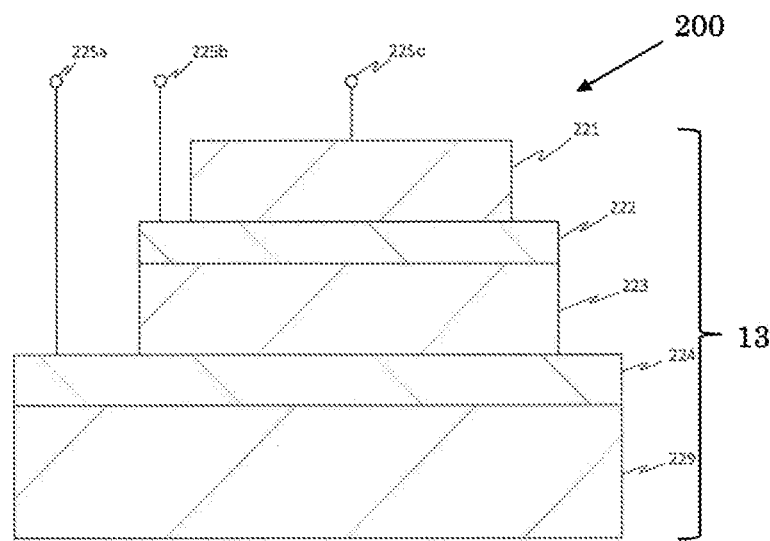
FIG. 4 shows a schematic top plan view of a semiconductor device of a fourth embodiment according to a present inventive subject matter.

FIG. 4 shows a schematic top plan view of a semiconductor device of a fourth embodiment according to a present inventive subject matter. The semiconductor device of this embodiment is a heterojunction bipolar transistor (HBT) includes a layered structure 13 including a first semiconductor layer and a second semiconductor layer. The layered structure 13 may include three or more layers including the first semiconductor layer and the second semiconductor layer. In this embodiment, the layered structure 13 may include at least two semiconductor layers selected from among an emitter layer 221, a base layer 222, and a collector layer 223. Also, as an embodiment of a semiconductor device 200 includes a base layer 222, an emitter layer 221 arranged on a first side of the base layer 222, a collector layer 223 arranged at a second side that is an opposite side of the first side of the base layer 222. The semiconductor device 200 may further include a sub-collector layer 224 and the substrate 229. The semiconductor device 200 further include an emitter electrode 225a electrically connected to the emitter layer 221, a collector electrode 225a electrically connected to the collector layer 223, and a base electrode 225b electrically connected to the base layer 222. A layered structure according to a present inventive subject matter is used as mentioned above, it is possible to obtain a semiconductor device with a high-frequency characteristic and a high-voltage resistance.

Figure 5A:
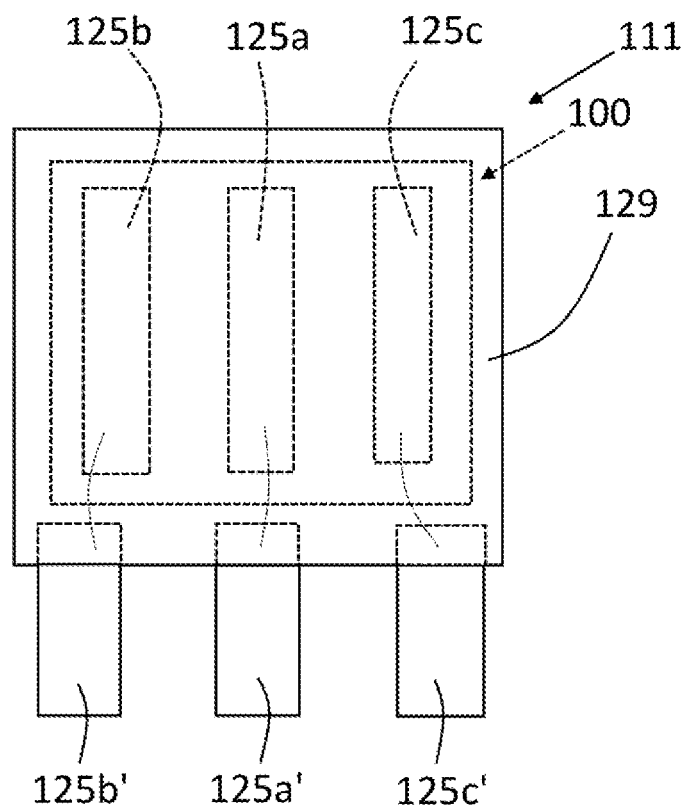
FIG. 5A shows a schematic top plan view of a semiconductor device of a fifth embodiment according to a present inventive subject matter.

FIG. 5A shows a schematic top plan view of a semiconductor device as a semiconductor package. The semiconductor device 111 further includes a resin sealing body 129 sealing at least a part of electrical connections. The semiconductor device 111 includes an electrode pad 125b' electrically connected to the source electrode 125b, a gate lead 125a' electrically connected to the gate electrode 125a, and a drain lead 125c' electrically connected to the drain electrode 125c. The electrical connections may be secured through bonding wire(s), bumps, and/or soldering, for example. The semiconductor device 111 according to this embodiment includes three leads arranged at one side of the semiconductor device 111. The leads may be electrically connected to a circuit board 1000 of a semiconductor system, for example.

Figure 5B:
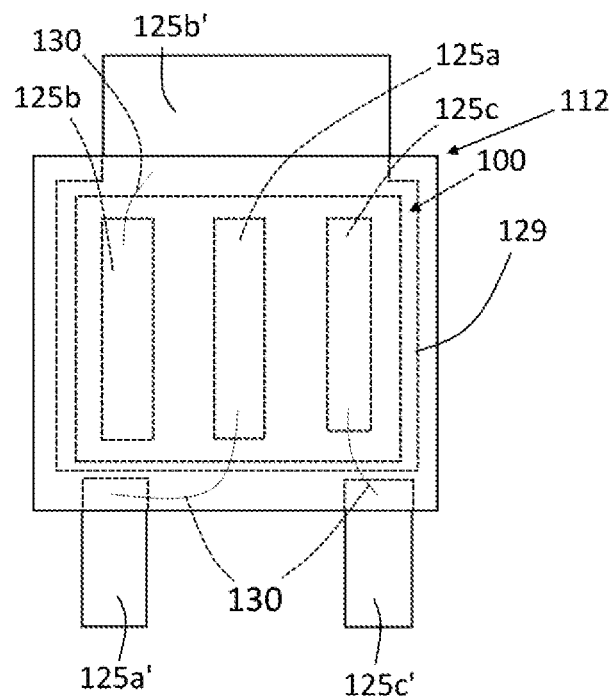
FIG. 5B shows a schematic top plan view of a semiconductor device of a sixth embodiment according to a present inventive subject matter.

FIG. 5B shows a schematic top plan view of a semiconductor device of a sixth embodiment according to a present inventive subject matter. In this embodiment, a layered structure including a first semiconductor layer and a second semiconductor layer is arranged on an electrode pad 125b' that may be electrically connected to the source electrode 125b for example. The layered structure may further include a gate lead 125a' electrically connected to the gate electrode 125a on the layered structure and a drain lead 125c' electrically connected to the drain electrode 125c on the layered structure. The semiconductor device 112 further includes a sealing resin 129 sealing at least a part of electrical connections of the semiconductor device 112. In this embodiment, the electrode pad 125b and the gate lead 125a' and the drain lead 125c' may be partly embedded in the sealing resin 129 and partly protrude from the sealing resin 129. The protruding portion of the gate lead 125a', the protruding portion of the drain lead 125c', and the protruding portion of the electrode pad 125b' may be electrically connected to electrode patterns of the circuit board 1000 of a semiconductor system, for example.

Figure 6:
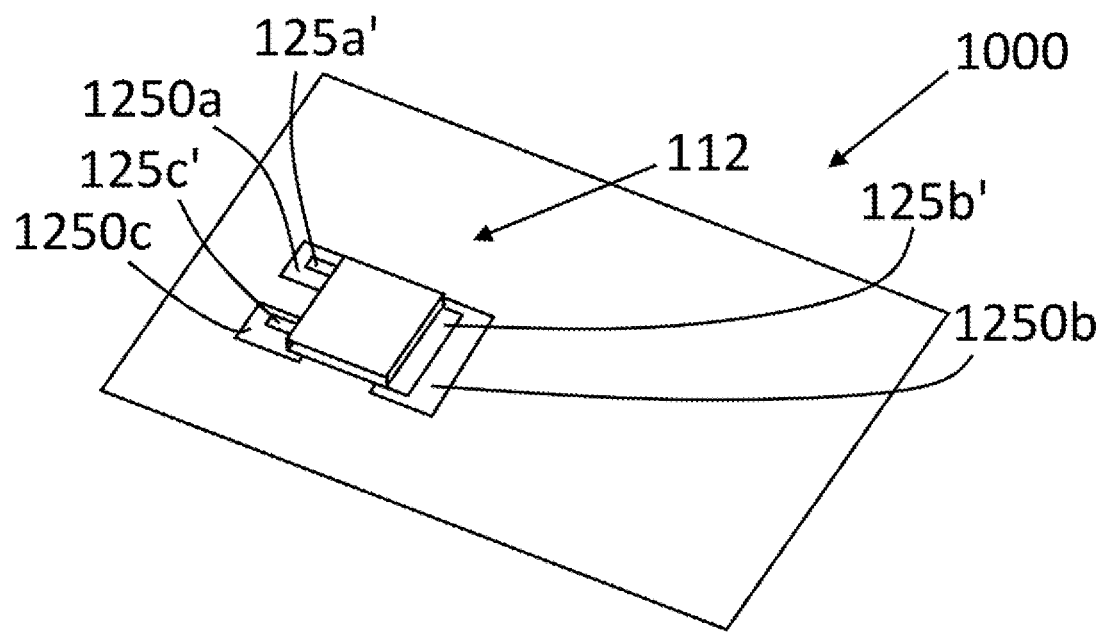
FIG. 6 shows a schematic perspective view of a semiconductor device of a seventh embodiment of a present inventive subject matter is arranged on a circuit board of a system.

FIG. 6 shows a schematic perspective view of a semiconductor device of an embodiment of a present inventive subject matter is arranged on a circuit board of a system.

Figure 7:
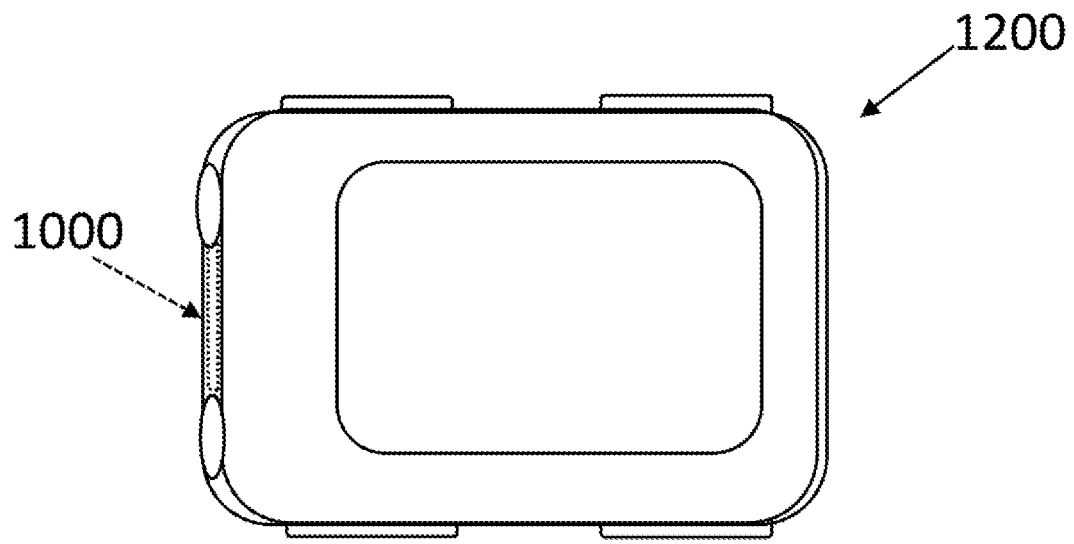
FIG. 7 shows a system includes a circuit board and a semiconductor device electrically mounted on the circuit board, according to an eighth embodiment of a present inventive subject matter.

FIG. 7 shows a system includes a circuit board and a semiconductor device electrically mounted on the circuit board. The system 1200 in this embodiment may be an automotive radar system including a circuit board 1000 that is positioned at a front side of a vehicle. The semiconductor device according to an embodiment of a present inventive subject matter is electrically mounted on the circuit board as a HEMT. The automotive radar system is configured to sense a distance between the vehicle and a target that may be another vehicle, a person, and/or an obstacle and to automatically control the distance and/or to inform a passenger and/or a driver in the vehicle of an existence of an obstacle, for example.

Figure 8:
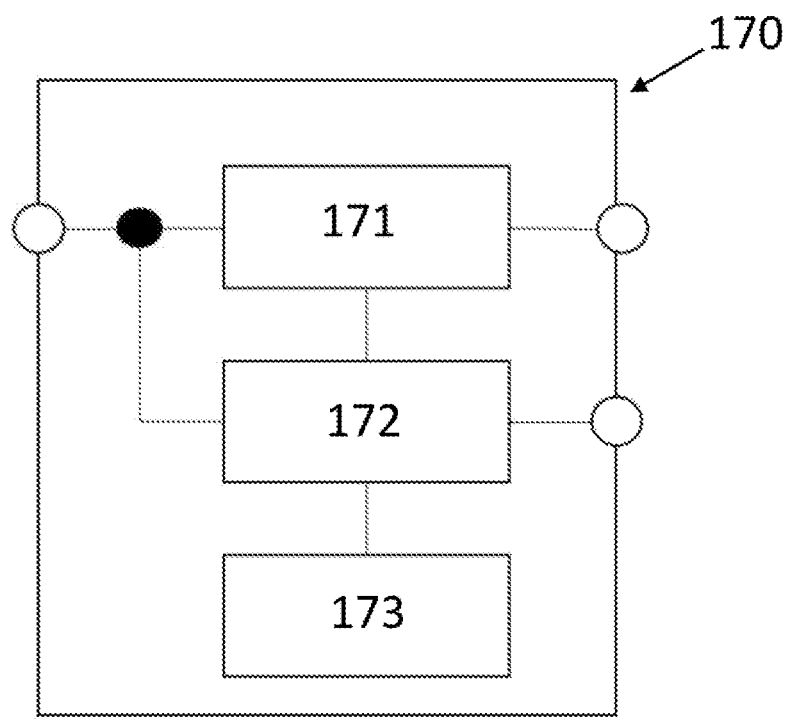
FIG. 8 shows a schematic view of a semiconductor system according to a ninth embodiment of a present inventive subject matter. The power device may include a semiconductor device.

The semiconductor device according to an embodiment of a present inventive subject matter may be used in various systems including an automotive radar, an antenna, a car navigation system, and a base station system for communication, for example. Also, the semiconductor device may be used in a power system by electrically connecting the semiconductor device and a circuit board of the power system. For example, FIG. 8 shows a schematic view of a semiconductor system according to a fourth embodiment of a present inventive subject matter. The semiconductor system may be a power system 170. The power system 170 may include a semiconductor device as a power device. Also, the power system 170 may include two or more power devices and a control circuit. The power system 170 shown in FIG. 8 includes a first power system 171 and a second power system 172 and a control circuit 173 that, are electrically connected to one another in the power system 170.

FIG. 9 shows a schematic view of a semiconductor system according to an embodiment of a present inventive subject matter. The semiconductor system may be a system device 180, as shown in FIG. 9. The system device 180 may include a power system 181 and an electric circuit 182 that may be combined with the power system 181.

Figure 10:
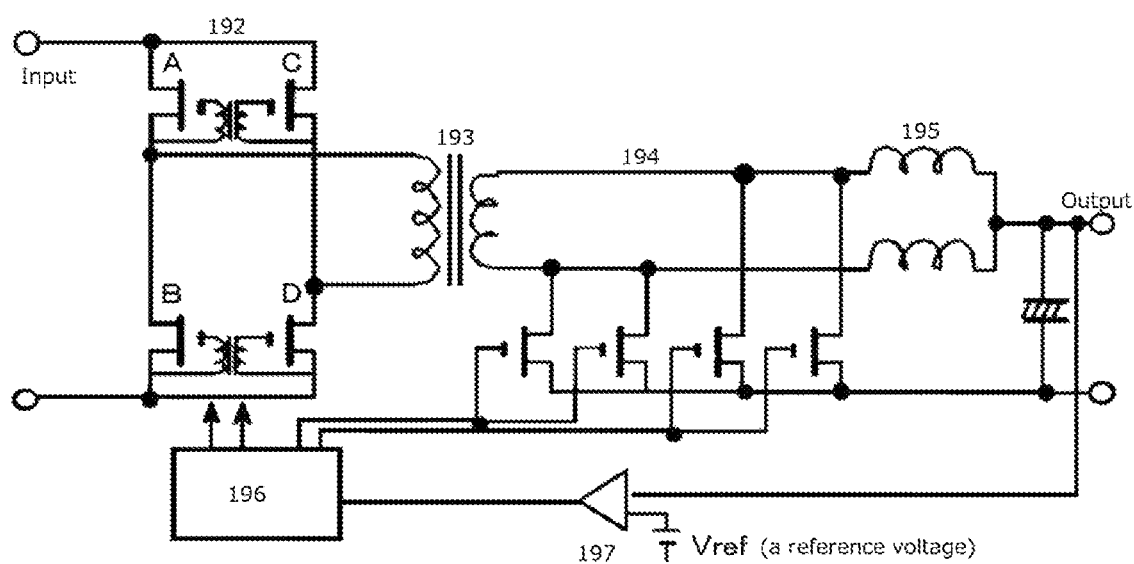
FIG. 10 shows a schematic diagram of a semiconductor system according to an eleventh embodiment of a present inventive subject matter.
Figure 11:
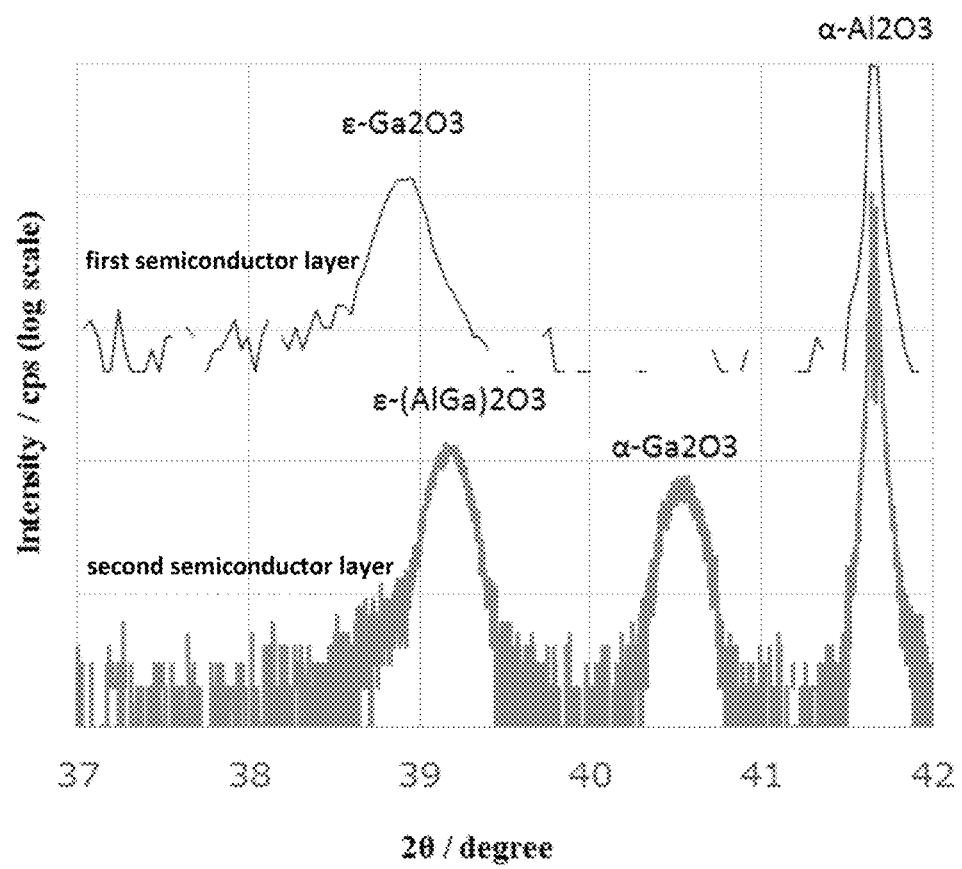
FIG. 11 shows a measurement result of an embodiment measured by an X-ray diffraction (XRD).
Figure 12:
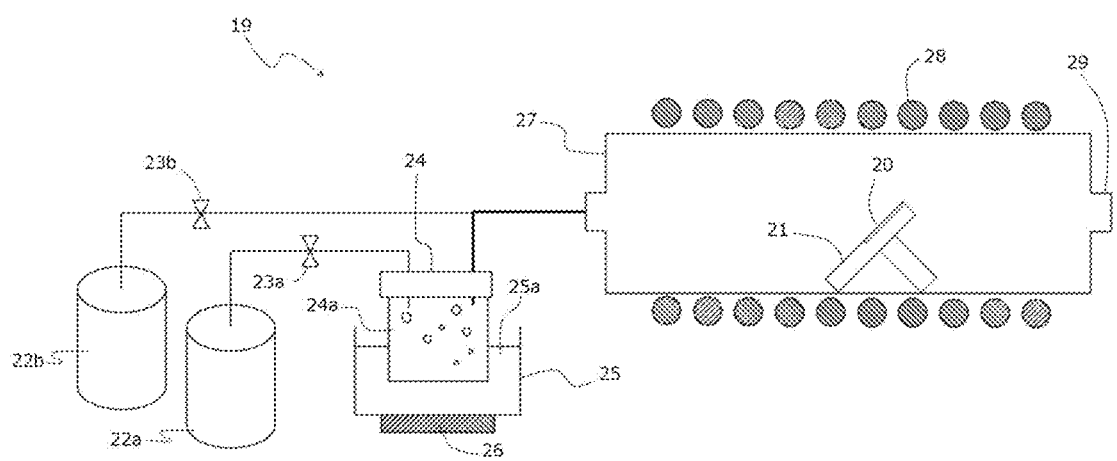
FIG. 12 shows a schematic diagram of a mist chemical vapor deposition (CVD) apparatus that may be used according to an embodiment of method of a present inventive subject matter.

FIG. 10 shows a schematic view of a circuit diagram of power supply of a semiconductor system according to an embodiment of a present inventive subject matter. FIG. 10 illustrates a power supply circuit 191 of a power supply device, including a power circuit and a control circuit. A DC voltage is switched at high frequencies by an inverter 192 (configured with MOSFET A to D) to be converted to AC, followed by insulation and transformation by a transformer 193. The voltage is then rectified by rectification MOSFETs 194 and then smoothed by a DCL 195 (smoothing coils L1 and L2) and a capacitor to output a direct current voltage. At this point, the output voltage is compared with a reference voltage by a voltage comparator 197 to control the inverter and the rectification MOSFETs by a PWM control circuit 196 to have a desired output voltage.

Some practical examples according to a present inventive subject matter are explained as follows, but the present inventive subject matter is not particularly limited thereto, because many alterations and modifications are considered to be possible, given the benefit of the present disclosure. Therefore, it must be understood that the described embodiments and practical examples have been set forth only for the purpose to show an example and it should not be taken as limiting a present inventive subject matter.

Practical Example 1

1. Film (Layer) Formation Apparatus

FIG. 1 shows a mist CVD apparatus used in this example. The mist CVD apparatus 19 may include a susceptor 21 on which a substrate 20 is placed. The mist CVD apparatus 19 includes a carrier gas supply device 22a, a first flow-control valve 23a to control a flow of a carrier gas that is configured to be sent from the carrier gas supply device 22a, a diluted carrier gas supply device 22b, a second flow-control valve 23b to control a flow of a carrier gas that is configured to be sent from the diluted carrier gas supply device 22b, a mist generator 24 in that a raw material solution 24a is contained, a container 25 in that water 25a is contained, an ultrasonic transducer that may be attached to a bottom surface of the container 25, a supply pipe 27 that may be a quartz pipe with an inside diameter that may be 40 mm, and a heater 28 arranged at a peripheral portion of the supply pipe. The susceptor 21 includes a surface that is slanted off the horizontal and on that the substrate 20 is arranged. The susceptor 21 is made of quartz. Since the susceptor 21 and the supply pipe 27 that are configured to be a film (layer)-formation chamber are made of quartz, this configuration reduces a possibility that a foreign substance entering a film that is formed on the substrate 20.

2. Preparation of a Raw-Material Solution

Aqueous gallium bromide solution of 0.1 mol/L and aqueous gallium aluminum solution of 0.1 mol/L were mixed was to be a raw-material solution 24a for a second semiconductor layer. Also, aqueous gallium bromide solution without adding aqueous gallium aluminum was prepared to be a raw material solution 24a for a first semiconductor layer.

3. Film (Layer) Formation Preparation

The raw-material solution 24a obtained at 2, the Preparation of the Raw-Material Solution above was set in the mist generator 24. Then, a sapphire substrate as a base 20 was placed on the susceptor 21, and the heater 28 was activated to raise the temperature in the supply pipe 27 up to 550° C. The first flow-control valve 23a and the second flow-control valve 23b were opened to supply a carrier gas from the carrier gas source 22a and the diluted carrier gas source 22b, which are the source of carrier gas, into the supply pipe 27 to replace the atmosphere in the supply pipe 27 with the carrier gas sufficiently. After the atmosphere in the supply pipe 27 was sufficiently replaced with the carrier gas, the flow rate of the carrier gas from the carrier gas source 22a was regulated at 5.0 L/min. and the diluted carrier gas from the diluted carrier source 22b was regulated at 0.5 L/min. In this embodiment, oxygen was used as the carrier gas.

4. Formation of Semiconductor Layer (a Second Semiconductor Layer)

The ultrasonic transducer 26 was then vibrated at 2.4 MHz. and the vibrations were propagated through the water 25a to the raw material solution 24a to atomize the raw material solution 24a to form atomized droplets. The atomized droplets were introduced in the supply pipe 27 with the carrier gas. The supply pipe 27 was heated by a heater 28 up to 550° C. and the atomized droplets were thermally reacted under atmospheric pressure in the supply pipe 27 to form a layer on the base 20. The layer that was obtained was used as a second semiconductor layer. The layer formation time was 10 minutes.

5. Formation of Semiconductor Layer (a First Semiconductor Layer)

A semiconductor layer is obtained as a first semiconductor layer similarly to the second semiconductor layer except the following conditions: without using aqueous bromide aluminum solution; and the supply pipe 27 was heated by a heater 28 up to 350° C. instead of heated up to 550° C.

6. Evaluation

Using an X-ray diffraction (XRD) device, crystalline structures of the first semiconductor layer and the second semiconductor layer are respectively measured, and the results are shown in FIG. 7. FIG. 7 clearly indicates that the first semiconductor layer contains an ε-phase crystalline oxide semiconductor and the second semiconductor layer contains an ε-phase crystalline oxide semiconductor. The reason of the second semiconductor layer contains $\alpha$-$Ga_2O_3$ that has α-phase crystalline structure is considered to be the higher heating temperature of the supply tube 27 than the heating temperature of the supply tube 27 to form the first semiconductor layer. Heating temperatures may vary depending on a film (layer) formation apparatus and/or components of a raw material solution, however, to obtain an ε-$(AlGa)_2O_3$ is required to set the heating temperature to be below 400° C. around 350° C. similarly to the heating temperature to obtain the first semiconductor layer.

Practical Example 2

Another second semiconductor layer was obtained similarly to form the second semiconductor layer as mentioned above at 4 with the same conditions. Also, another first semiconductor layer was obtained similarly to form the first semiconductor layer as mentioned above at 5 except the following conditions: using an aqueous solution prepared by mixing an aqueous gallium bromide solution (0.1 mol/L) and an aqueous indium bromide solution (0.1 mol/L) and adding tin bromide so that the aqueous solution contains gallium and tin in terms of atomic ratio to be gallium:tin=1: 0.01, and the heating temperature was 650° C. instead of 350° C. In this example, a layered structure including the first semiconductor layer and the second semiconductor layer layered on the first semiconductor layer was obtained. Similarly to the practical example 1, using an X-ray diffraction (XRD) device, crystalline structures of the first semiconductor layer and the second semiconductor layer of the layered structure obtained in the practical example 2 were respectively measured, and the first semiconductor layer was found to contain an ε-phase crystalline oxide semiconductor and the second semiconductor layer was also found to contain an ε-phase crystalline oxide semiconductor, similarly to the first semiconductor layer and the second semiconductor layer in the practical example 1.

A semiconductor layer and/or a layered structure according to embodiments of a present inventive subject matter may be used in semiconductor devices and semiconductor systems in various fields. Examples of the semiconductor system include an automotive radar, an antenna, a car navigation system, and a base station system for communication.

REFERENCE NUMBER DESCRIPTION 1 a first semiconductor layer
2 a second semiconductor layer
3 a third layer
10 a layered structure
11 a layered structure
12 a layered structure
13 a layered structure
19 a mist CVD apparatus
20 a base
21 a susceptor
22a a carrier gas supply device
22b a dilution carrier gas supply device
23a a flow-control valve of carrier gas
23b a flow-control valve of dilution carrier gas
24 a mist generator
24a a raw material solution
25 a container
25a water
26 an ultrasonic transducer
27 a supply pipe
28 a heater
29 an air duct
121a a first n type semiconductor layer with a first bandgap
121b a second n type semiconductor layer with a second bandgap smaller than the first bandgap
121c an n+ type semiconductor layer
124 a semi-insulating layer
125a a gate electrode
125b a source electrode
125c a drain electrode
128 a third layer
221 an emitter layer
222 a base layer
223 a collector layer
224 a sub-collector layer
225a a collector electrode
225b a base electrode
229 a substrate
1000 a circuit board

What is claimed is:

1. A layered structure, comprising:
a first semiconductor layer comprising a first ε-phase crystalline oxide semiconductor with a first composition; and
a second semiconductor layer comprising a second ε-phase crystalline oxide semiconductor with a second composition that is different from the first composition of the first semiconductor layer, the second semiconductor layer layered on the first semiconductor layer.

2. The layered structure of claim 1, wherein
the first semiconductor layer comprises as a major metal component at least one selected from among gallium, indium and aluminum.

3. The layered structure of claim 1, wherein
the first semiconductor layer comprises a mixed crystal, the mixed crystal comprising as a major metal component at least two selected from among gallium, indium and aluminum.

4. The layered structure of claim 1, wherein
the first semiconductor layer comprises ε-$Ga_2O_3$.

5. The layered structure of claim 1, wherein
the first semiconductor layer comprises a mixed crystal comprising ε-$Ga_2O_3$.

6. The layered structure of claim 1, wherein
the second semiconductor layer comprises gallium as a major metal component.

7. The layered structure of claim 1, wherein
the second semiconductor layer comprises ε-$Ga_2O_3$.

8. The layered structure of claim 1, wherein
the second semiconductor layer comprises a mixed crystal comprising ε-$Ga_2O_3$.

9. The layered structure of claim 1, wherein
the second semiconductor layer comprises aluminum.

10. The layered structure of claim 1, wherein
the second semiconductor layer comprises $(GaInAl)_2O_3$.

11. The layered structure of claim 1, further comprising:
three or more semiconductor layers comprising the first semiconductor layer and the second semiconductor layer.

12. The layered structure of claim 1, further comprising:
a heterojunction between the first semiconductor layer and the second semiconductor layer.

13. The layered structure of claim 11, further comprising:
a heterojunction between two semiconductor layers selected from among the three or more semiconductor layers.

14. The layered structure of claim 11, further comprising:
an electrically insulating layer.

15. A semiconductor device, comprising:
a layered structure comprising:
a first semiconductor layer comprising a first ε-phase crystalline oxide semiconductor with a first composition; and
a second semiconductor layer comprising a second ε-phase crystalline oxide semiconductor with a second composition that is different from the first composition of the first semiconductor layer, the second semiconductor layer layered on the first semiconductor layer;
a first electrode electrically connected to the layered structure; and
a second electrode electrically connected to the layered structure.

16. The semiconductor device of claim 15, wherein
the semiconductor device is a power device.

17. The semiconductor device of claim 16, wherein
the semiconductor device is a semiconductor device with a high-frequency characteristic.

18. The semiconductor device of claim 16, wherein
the semiconductor device is a high-electron-mobility transistor or a heterojunction bipolar transistor.

19. A system, comprising:
a circuit board; and
a semiconductor device comprising:
a layered structure comprising:
a first semiconductor layer comprising a first ε-phase crystalline oxide semiconductor with a first composition; and
a second semiconductor layer comprising a second ε-phase crystalline oxide semiconductor with a second composition that is different from the first composition of the first semiconductor layer, the second semiconductor layer layered on the first semiconductor layer;
a first electrode electrically connected to the layered structure; and a second electrode electrically connected to the layered structure.

* * * * *